(12) United States Patent
Poon et al.

(10) Patent No.: US 11,754,611 B2
(45) Date of Patent: Sep. 12, 2023

(54) ELECTROMAGNETIC INTERFERENCE SUPPRESSION CIRCUIT AND RELATED SENSING CIRCUIT

(71) Applicant: AnApp Technologies Limited, Kowloon (HK)

(72) Inventors: Franki Ngai Kit Poon, Shatin (HK); Peter On Bon Chan, Shatin (HK)

(73) Assignee: AnApp Technologies Limited, Kowloon (HK)

( * ) Notice: Subject to any disclaimer, the term of this patent is extended or adjusted under 35 U.S.C. 154(b) by 240 days.

(21) Appl. No.: 17/275,598

(22) PCT Filed: Jul. 21, 2020

(86) PCT No.: PCT/CN2020/103351
§ 371 (c)(1),
(2) Date: Mar. 11, 2021

(87) PCT Pub. No.: WO2022/016395
PCT Pub. Date: Jan. 27, 2022

(65) Prior Publication Data
US 2022/0026480 A1    Jan. 27, 2022

(51) Int. Cl.
*G01R 31/00* (2006.01)
(52) U.S. Cl.
CPC ................................. *G01R 31/002* (2013.01)
(58) Field of Classification Search
CPC .. G01R 31/002; G01R 19/0053; G01R 17/06; H02M 1/44
See application file for complete search history.

(56) References Cited

U.S. PATENT DOCUMENTS

| 10,396,656 | B1 | 8/2019 | Poon et al. |
| 10,404,160 | B2 | 9/2019 | Chan |

(Continued)

FOREIGN PATENT DOCUMENTS

| CN | 100403633 C | 7/2008 |
| CN | 104081640 A | 10/2014 |

(Continued)

OTHER PUBLICATIONS

LC circuit, available at https://en.wikipedia.org/wiki/LC_circuit on Jun. 12, 2020 (Year: 2020).*

(Continued)

*Primary Examiner* — Daniel R Miller
(74) *Attorney, Agent, or Firm* — RENNER KENNER GREIVE BOBAK TAYLOR & WEBER

(57) ABSTRACT

An electromagnetic interference suppression circuit and a related sensing circuit. The sensing circuit includes an input and an output operatively coupled with the input. The input is adapted to be connected on a power line and in series between a load and a shunt circuit connected across power lines between a power source and the load. The output is adapted to provide a signal ($V_s$) associated with an electromagnetic interference signal ($V_n$) generated by or at the load and arranged to be experienced by the shunt circuit. The signal ($V_s$) can be used for determining a suppression signal ($V_n'$) for reducing, or substantially eliminating, the electromagnetic interference signal ($V_n$). The electromagnetic interference suppression circuit includes the sensing circuit, a regulator circuit, and a controlled signal source.

16 Claims, 3 Drawing Sheets

(56) References Cited

U.S. PATENT DOCUMENTS

| | | | |
|---|---|---|---|
| 2002/0063474 A1* | 5/2002 | Wasaki | H03H 7/427 |
| | | | 307/89 |
| 2007/0200455 A1 | 8/2007 | Yamaguchi | |
| 2009/0290392 A1* | 11/2009 | Ganev | H03H 7/1766 |
| | | | 363/39 |
| 2010/0283437 A1* | 11/2010 | Chung | H02M 1/44 |
| | | | 323/212 |
| 2014/0292401 A1* | 10/2014 | Shen | H03H 11/126 |
| | | | 327/552 |
| 2015/0003124 A1 | 1/2015 | Sakai et al. | |
| 2016/0173052 A1 | 6/2016 | Chen | |

FOREIGN PATENT DOCUMENTS

| | | |
|---|---|---|
| CN | 104578755 A | 4/2015 |
| CN | 204408189 U | 6/2015 |
| CN | 111181378 A | 5/2020 |
| CN | 111213308 A | 5/2020 |

OTHER PUBLICATIONS

B. Narayanasamy and F. Luo, "A Survey of Active EMI Filters for Conducted EMI Noise Reduction in Power Electronic Converters," in IEEE Transactions on Electromagnetic Compatibility, vol. 61, No. 6, pp. 2040-2049, Dec. 2019 (Year: 2019).*

* cited by examiner (prior art)

ELECTROMAGNETIC INTERFERENCE SUPPRESSION CIRCUIT AND RELATED SENSING CIRCUIT

TECHNICAL FIELD

The invention relates to suppression of conducted electromagnetic interference signals in circuits.

BACKGROUND OF THE INVENTION

Electromagnetic interference suppression circuits are known and are commonly used for suppressing conducted electromagnetic interference signals present on signal or power lines. These conducted electromagnetic interference signals can be classified into differential mode electromagnetic interference signals, which are conducted on the power supply line and the power return line in opposite directions, and common mode electromagnetic interference signals, which are conducted on the power supply line and the power return line in the same direction.

In theory, an electromagnetic interference suppression circuit is able to generate a suppression signal that can reduce or even eliminate the unwanted electromagnetic interference signal. For the best suppression performance, the generated suppression signal should be a negative of the electromagnetic interference signal (e.g., equal in magnitude and anti-phase) so that the two always completely cancel each other. In practice, however, a substantial or complete cancellation can be difficult to achieve.

FIG. 1 shows an existing electromagnetic interference suppression circuit 10 arranged to suppress differential mode electromagnetic interference signals between a power source 20 and an electronic circuit 30 (as a load). A shunt capacitor $C_x$ is connected across the power lines, in parallel between the power source 20 and the electronic circuit 30. The circuit 10 includes a sensing circuit 12 connected across the power lines, in parallel between the capacitor $C_x$ and the electronic circuit 30, to sense a conducted electromagnetic interference signal $V_n$ generated by the electronic circuit 30. The circuit 10 also includes an amplifier 14 that connects with the sensing circuit 12, and a voltage source 16 that connects with and controlled by the amplifier 14. The amplifier 14 amplifies the signal obtained from the sensing circuit 12 and provides a control signal to control the voltage source 16 such that the voltage source 16 outputs a suppression signal $V_n'$ that counteracts the interference signal $V_n$ to prevent the interference signal $V_n$ from passing into the power source 20. One potential problem with circuit 10 is that during operation the sensing circuit 12 will pick up not only the electromagnetic interference signals $V_n$ generated by the electronic circuit 30 but also the electromagnetic interference signals from the power source 20. The electromagnetic interference signals from the power source 20, detected by the sensing circuit 12 and subsequently amplified by the amplifier 14, will inevitably affect or degrade the suppression performance of the circuit 10.

SUMMARY OF THE INVENTION

One of the objectives of the invention is to address the above needs, to overcome or substantially ameliorate the above disadvantages or, more generally, to provide an improved or otherwise alternative electromagnetic interference suppression circuit that can effectively reduce or even substantially eliminate conducted differential mode electromagnetic interference signals in a circuit, e.g., generated at an electronic circuit on a load side.

In a first aspect of the invention, there is provided a sensing circuit for an electromagnetic interference suppression circuit. The sensing circuit may be specifically configured for use in an electromagnetic interference suppression circuit. The sensing circuit includes an input and an output operatively coupled with the input. The input is adapted to be connected on a power line and in series between (1) a load (e.g., electronic circuit) and (2) a shunt circuit connected across power lines between a power source (AC) and the load. The output is adapted to provide a signal associated with an electromagnetic interference signal generated by or at the load and arranged to be experienced by the shunt circuit. The signal provided by the output can be used for determining a suppression signal for reducing, or substantially eliminating, the electromagnetic interference signal. The input and output may be isolated such that the input terminals or nodes are not identical to the output terminals or nodes. Alternatively, the input and output may be non-isolated such that the input terminals or nodes are the same terminals or nodes as the output terminals or nodes. The shunt circuit is a high pass circuit.

In one embodiment of the first aspect, the sensing circuit includes a resonator circuit. The resonator circuit may provide the input, the output, or both the input and the output. The resonator circuit may be configured with a resonance frequency arranged below a frequency of the electromagnetic interference signal ($V_n$) to be suppressed and above a frequency of the power source. The resonator circuit may include a capacitive circuit and an inductive circuit connected in parallel. The capacitive circuit may include one or more capacitors, e.g., connected in series, parallel, or partly series and partly parallel; the inductive circuit may include one or more inductors, e.g., connected in series, parallel, or partly series and partly parallel. In one example, the capacitive circuit consists of a single capacitor and the inductive circuit consists of a single inductor. The sensing circuit may consist of or consist essentially of the resonator circuit, or the sensing circuit may include addition circuit or circuit component apart from the resonator circuit.

In one embodiment of the first aspect, the sensing circuit further includes a transformer connected in parallel with the resonator circuit. One of the transformer and the resonator circuit provides the input of the sensing circuit and the other one of the transformer and the resonator circuit provides the output of the sensing circuit. The transformer includes primary and secondary coils. The primary coil may include one or more coil portions; the secondary coil may include one or more coil portions. The inductance of the coil of the transformer that connects directly in parallel with the resonator circuit is much greater than the inductance of the resonator circuit such that the effect of parallel resonance is negligible.

In one embodiment of the first aspect, the sensing circuit includes a transformer with primary and secondary coils, and a capacitive circuit connected in parallel with the transformer. The primary coil may include one or more coil portions; the secondary coil may include one or more coil portions. The capacitive circuit may include one or more capacitors. One of the transformer and the capacitive circuit provides the input and the other one of the transformer and the capacitive circuit provides the output. The capacitive circuit may include one or more capacitors, e.g., connected in series, parallel, or partly series and partly parallel. In one example, the capacitive circuit consists of a single capacitor.

In one implementation, the capacitive circuit is connected in parallel with the primary coil to define a resonator circuit. In another implementation, the capacitive circuit is connected in parallel with the secondary coil to define a resonator circuit. In either case, the resonator circuit may be configured with a resonance frequency arranged below a frequency of the electromagnetic interference signal ($V_n$) to be suppressed and above a frequency of the power source.

In a second aspect of the invention, there is provided an electromagnetic interference suppression circuit that includes the sensing circuit of the first aspect, with its input connected on the power line and in series between the power source (AC) and the load (e.g., electronic circuit). The electromagnetic interference suppression circuit also includes a regulator circuit arranged to regulate the signal ($V_s$) provided by the sensing circuit to provide a regulated signal; and a controlled signal source arranged to provide, based on the regulated signal, a suppression signal ($V_n'$) for reducing, or substantially eliminating, the electromagnetic interference signal ($V_n$). The suppression signal ($V_n'$) may be arranged to reduce the electromagnetic interference signal ($V_n$) by at least 90% or at least 95%. The suppression signal ($V_n'$) may have substantially the same magnitude as the electromagnetic interference signal ($V_n$), or an about 180 degrees phase shift from the electromagnetic interference signal ($V_n$), or both.

In one embodiment of the second aspect, the controlled signal source and the sensing circuit are connected on the same power line, either the higher potential power line or the lower potential power line. In another embodiment of the second aspect, the controlled signal source and the sensing circuit are connected on different power lines, or different sides of the power lines, e.g., one on the higher potential power line, the other on the lower potential power line. The higher potential power line may be referred to as a supply power line and may be at a positive potential; the lower potential power lines may be referred to as the return power line and may be at a negative potential.

In one embodiment of the second aspect, the controlled signal source is a controlled voltage source arranged to provide the suppression signal ($V_n'$) in the form of a suppression voltage signal. The signal ($V_s$) associated with an electromagnetic interference signal ($V_n$) is a voltage signal and the electromagnetic interference signal ($V_n$) is a voltage signal.

In one embodiment of the second aspect, the controlled signal source comprises a transformer. In one example, the controlled signal source may consist of or consist essentially of the transformer. The transformer includes primary and secondary coils. The primary coil may include one or more coil portions; the secondary coil may include one or more coil portions. The primary coil may act as input; the secondary coil may act as output that provides the suppression signal ($V_n'$). The output may be connected on the power line.

In one embodiment of the second aspect, the regulator circuit comprises an amplifier. The amplifier may be an operational amplifier. In one example, the regulator circuit may consist of or consist essentially of the amplifier. The amplifier may be connected with one or both of the power lines to obtain power from the connected power line(s).

In one embodiment of the second aspect, the sensing circuit has a gain factor $K_s$, the regulator circuit has a gain factor $K_a$, and the controlled signal source has a gain factor $K_v$. In one example, the signal ($V_s$) may be equal to the electromagnetic interference signal ($V_n$) times the gain factor of the sensing circuit. Each of the gain factors $K_s$, $K_a$, and $K_v$ may take any value so long as the controlled signal source can provide a suppression signal that can reduce the electromagnetic interference signal ($V_n$). In one example, the product of $K_s$, $K_a$, and $K_v$ may be 1. Depending on the construction of the circuit, other values of the product are possible, so long as the controlled signal source can provide a suppression signal that can reduce, or substantially eliminate, the electromagnetic interference signal ($V_n$).

In one embodiment of the second aspect, the electromagnetic interference suppression circuit further includes the shunt circuit connected across power lines between a power source and a load (e.g., electronic circuit). The shunt circuit is adapted to experience an electromagnetic interference signal ($V_n$), e.g., as a result of a noise signal ($V_{no}$) across the load.

In one embodiment of the second aspect, one of the controlled signal source and the sensing circuit is connected between the power source and the shunt circuit, and the other one of the controlled signal source and the sensing circuit is connected between the load and the shunt circuit.

In one embodiment of the second aspect, the shunt circuit comprises a capacitive circuit. The capacitive circuit may include one or more capacitors, e.g., connected in series, parallel, or partly series and partly parallel. In one example, the capacitive circuit consists of a single capacitor. The shunt circuit can be any other high pass circuit adapted to experience an electromagnetic interference signal ($V_n$).

In one embodiment of the second aspect, the electromagnetic interference suppression circuit is a stand-alone circuit. For example, the electromagnetic interference suppression circuit may be retrofitted to a circuit with a power source and a load.

In a third aspect of the invention, there is provided an electrical device including the sensing circuit of the first aspect or the electromagnetic interference suppression circuit of the second aspect.

Terms of degree such as "about", "substantially", or the like, are used herein to account for the general tolerances and non-ideal characteristics associated with the various circuit components and inevitable signal fluctuation in practice. The expressions "gain factor" or the like is used herein to generally indicate a multiplication factor, which may take any number larger than 1, equal to 1, or smaller than 1.

Other feature, aspects, objectives, and advantages of the invention will become apparent to the skilled person by considering the detailed description and accompanying drawings. For example, any feature(s) described herein in relation to one aspect or embodiment may be combined with any other feature(s) described herein in relation to any other aspect or embodiment as appropriate and applicable.

BRIEF DESCRIPTION OF DRAWINGS

Embodiments of the invention will now be described, by way of example, with reference to the accompanying drawings in which.

DETAILED DESCRIPTION OF PREFERRED EMBODIMENT

Figure 2:
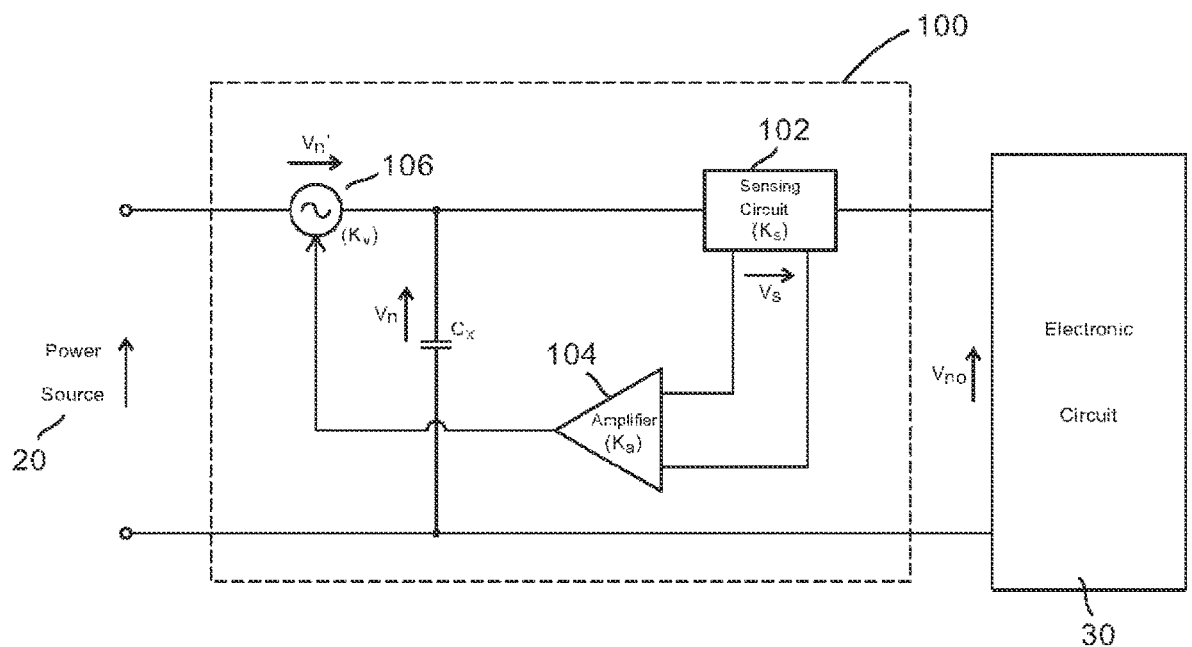
FIG. 2 is a circuit diagram of a control circuit for suppressing electromagnetic interference signals in one embodiment of the invention.

FIG. 2 shows a control circuit 100 for suppressing differential mode electromagnetic interference signals in one embodiment of the invention. The control circuit 100 is arranged between the power source 20 and the electronic circuit 30 (as a load). The power source 20 is adapted to power the electronic circuit 30. In one application the control circuit 100 can suppress differential mode electromagnetic interference signals generated by the electronic circuit 30.

The control circuit 100 includes a shunt circuit and an electromagnetic interference suppression circuit. The shunt circuit is formed by a capacitor $C_x$ connected between the power source 20 and the electronic circuit 30. The electromagnetic interference suppression circuit includes a sensing circuit 102 that is connected on a supply power line and is arranged in series between the capacitor $C_x$ and the electronic circuit 30. The sensing circuit 102 has a gain factor $K_s$ and includes an input (e.g., input terminals/nodes) on the power line and an output (e.g., output terminals/nodes). The input and output of the sensing circuit 102 may be isolated (i.e., the input terminals/nodes are different from the output terminals/nodes), or may not be isolated (i.e., the input terminals/nodes are the same as the output terminals/nodes), as explained in greater detail below. The sensing circuit 102 is adapted to detect the electromagnetic interference signal $V_n$ to be suppressed across the capacitor $C_x$ as a result of the noise signal $V_{no}$ generated by the electronic circuit 30 so as to prevent the interference signals from reaching the power source 20. Based on the detection, the sensing circuit 102 is adapted to output a signal $V_s$ associated with (e.g., correlated to) the electromagnetic interference signal $V_n$. In one example, the signal $V_s$ equals to the interference signal $V_n$ times the gain factor $K_s$ of the sensing circuit 102. If the factor $K_s$ is about 1, the signal $V_s$ is substantially the same as the electromagnetic interference signal $V_n$.

The electromagnetic interference suppression circuit also includes regulator circuit, in the form of an amplifier 104, and a controlled voltage source 106. The amplifier 104 has a gain factor $K_a$, and includes two input terminals connected with the output terminals of the sensing circuit 102, and an output terminal connected with the controlled voltage source. The amplifier 104 may take the signal $V_s$ as input, regulate it by a gain factor $K_a$, and produce an output signal equals to the signal $V_s$ times the gain factor $K_a$ of the amplifier 104. The controlled voltage source is connected the supply power line and is arranged in series between the power source 20 and the capacitor $C_x$. The controlled voltage source 106 has a gain factor $K_v$, and includes an input connected with the output of the amplifier 104 and an output connected on the supply power line between the power source 20 and the capacitor $C_x$. The output signal $V_n'$ of the controlled voltage source 106 equals to the signal outputted from the amplifier 104 times the gain factor $K_v$ of the controlled voltage source 106. In one implementation, the controlled voltage source 106 is formed by a transformer, with a primary coil as the input and the secondary coil as the output, and the turns ratio N of the transformer (number of turns of secondary coil divided by number of turns of primary coil of transformer) defining the gain factor $K_v$. In one example, the signal $V_s$ is substantially the same as the electromagnetic interference signal $V_n$, and the product of the gain factors $K_s$, $K_a$ and $K_v$ has a magnitude of about 1 and a phase difference of about 180 degrees from the electromagnetic interference signal $V_n$. This prevents the interference signal $V_n$ from propagating into the power source 20. In this embodiment, the electromagnetic interference suppression circuit forms a loop.

Figure 1:
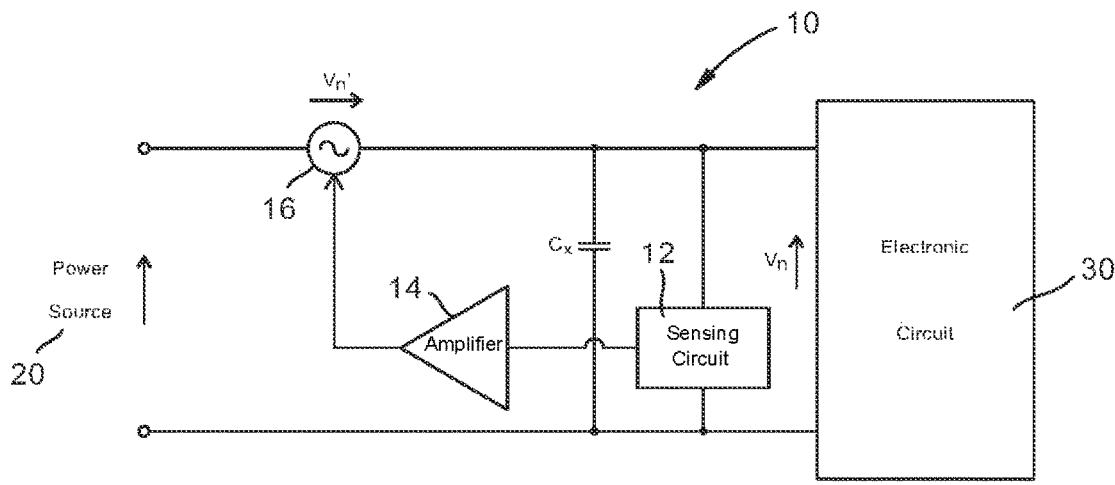
FIG. 1 is a circuit diagram of an existing circuit for suppressing electromagnetic interference signals.

In this embodiment, the signals $V_n$, $V_{no}$, $V_s$, and $V_n'$ are in the form of voltage signals. The sensing circuit 102 achieves its function to sense the interference voltage signal $V_n$ based on the Kirchhoff's voltage law. Referring to FIG. 2, according to Kirchhoff's voltage law, the sum of the voltage across the input of the sensing circuit 102 and the interference voltage signal $V_n$ across capacitor $C_x$ should equal the interference signal $V_{no}$ appearing across (e.g., generated by) the electronic circuit 30. In one embodiment in which the input and the output of the sensing circuit 102 are not isolated, the output voltage signal $V_s$ from the sensing circuit 102 is the same as the signal at the input of the sensing circuit 102. In one embodiment in which the input and the output of the sensing circuit 102 are isolated, the output voltage signal $V_s$ from the sensing circuit 102 equals the signal at the input of the sensing circuit 102 times the gain factor of the sensing circuit 102. The arrangement of the electromagnetic interference suppression circuit, in particular the sensing circuit 102, minimizes the influence of the interference signals from the power source 20 on the electromagnetic interference suppression performance. The relatively high immunity to the interference signals from the power source 20 is due to capacitor $C_x$ providing a low impedance path for the interference signal from the power source 20 (which are high frequency signals). Such path has relatively low impedance compared with the impedance of the input of the sensing circuit 102 in series with the impedance across the electronic circuit 20. In addition, the interference signals from the power source 20 seen by the sensing circuit 102 is substantially reduced, as the interference signals appearing at capacitor $C_x$ due to the interference signal from the power source 20 are divided based on the ratio of the impedance of sensing circuit 102 to the sum of impedance of sensing circuit 102 and the input impedance of the electronic circuit 30. This arrangement provides improved electromagnetic interference suppression performance over some existing circuits such that in FIG. 1.

Figure 3:
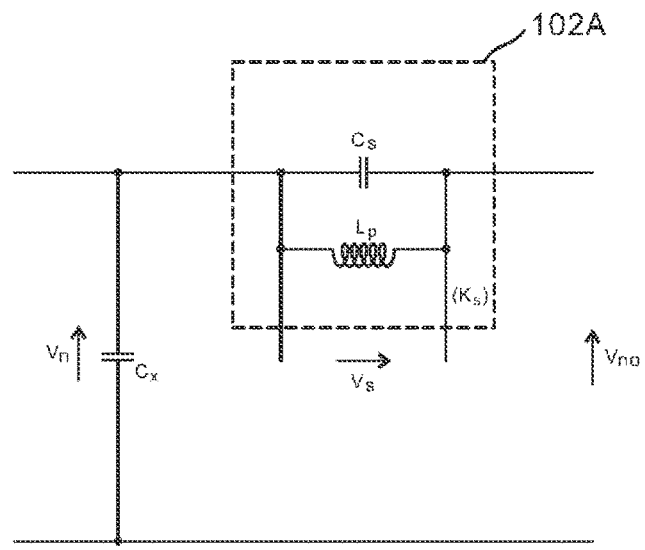
FIG. 3 is a circuit diagram of an implementation of a portion of the control circuit of FIG. 2 in one embodiment of the invention.

FIG. 3 shows an implementation of the sensing circuit 102A in one embodiment. In this embodiment, the input and the output of the sensing circuit 102A are not isolated. The terminals/nodes of the sensing circuit 102A are connected in series between the interference signal source $V_{no}$ and the capacitor $C_x$. The sensing circuit 102A includes a capacitor $C_s$ and an inductor $L_p$ connected in parallel forming a resonator circuit. The resonance frequency of the resonator circuit is arranged below the minimum frequency of the electromagnetic interference signal $V_n$ to be suppressed across the capacitor $C_x$ and above a frequency of the power source 20 such that the sensing circuit 102A can provide high pass and low pass functions as needed, e.g., be considered as capacitor for high frequency signals and inductor for low frequency signals.

The interference signal $V_n$ to be suppressed across the capacitor $C_x$ and the signal $V_s$ outputted by the sensing circuit 102A can be considered as a capacitive voltage divider of the noise signal $V_{no}$ according to Kirchhoff's voltage law as in the following expressions:

$$V_n = \frac{C_s}{(C_s + C_x)} V_{no}$$

$$V_s = \frac{C_x}{(C_s + C_x)} V_{no}$$

Hence $$\frac{V_s}{V_n} = \frac{C_x}{C_s}$$

Or $$V_s = \frac{C_x}{C_s} V_n = K_s V_n$$

In this example, the gain factor $K_s$ of the sensing circuit 102A equals to a capacitance of the capacitor $C_x$ divided by capacitance of the capacitor $C_s$. The inductor $L_p$ may enable the flow of power (e.g., current, low frequency in nature) from the power source 20 to the electronic circuit 30 while the capacitor $C_s$ presents a high impedance to prevent the flow of power (e.g., current, low frequency in nature) from the power source 20 to the electronic circuit 30.

Figure 4:
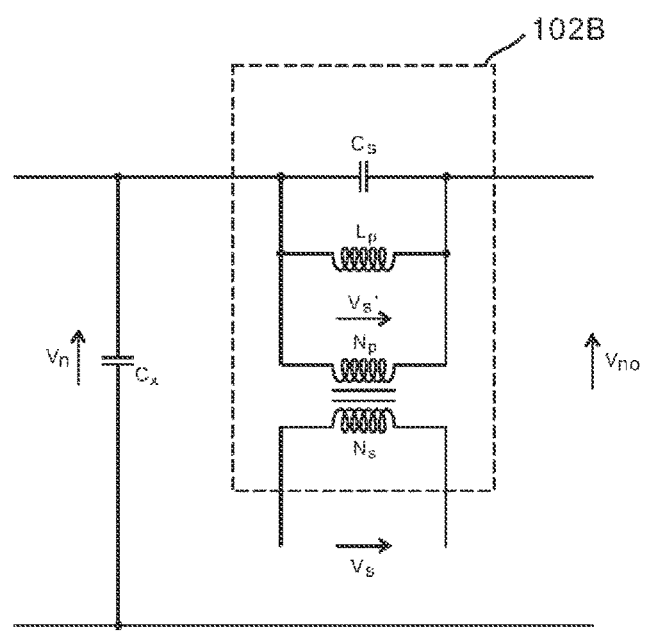
FIG. 4 is a circuit diagram of an implementation of a portion of the control circuit of FIG. 2 in one embodiment of the invention.

FIG. 4 shows another implementation of the sensing circuit 102B in one embodiment. In this embodiment, the input and the output of the sensing circuit 102B are isolated. The input terminals/nodes of the sensing circuit 102B are connected in series between the interference signal source $V_{no}$ and the capacitor $C_x$. The sensing circuit 102B includes a capacitor $C_s$ and an inductor $L_p$ connected in parallel forming a resonator circuit and arranged at the input of the sensing circuit 102B, and a transformer connected in parallel to the resonator circuit and arranged at the output of the sensing circuit 102B. The transformer includes primary coil with $N_p$ turns and a secondary coil with $N_s$ turns, defining a turns ratio N ($N_s/N_p$). The primary coil is connected directly in parallel with the inductor $L_p$. The transformer provides isolation between the input and output of the sensing circuit 102B, and an additional voltage gain factor equals to the turns ratio N. The resonance frequency of the resonator circuit is arranged below the minimum frequency of the electromagnetic interference signal $V_n$ to be suppressed across the capacitor $C_x$ and above a frequency of the power source 20 such that the sensing circuit 102B can provide high pass and low pass functions as needed, e.g., can be considered as capacitor for high frequency signals and inductor for low frequency signals. In this implementation, the inductance of the primary coil of transformer is much greater than the inductance of inductor $L_p$ such that there exists negligible parallel resonance effect.

The interference signal $V_n$ to be suppressed across the capacitor $C_x$ and the sensed sign $V_s'$ at the input of sensing circuit 102B can be considered as a capacitive voltage divider of the noise signal $V_{no}$ according to Kirchhoff's voltage law as in the following expressions:

$$V_n = \frac{C_s}{(C_s + C_x)} V_{no}$$

$$V_s' = \frac{C_x}{(C_s + C_x)} V_{no}$$

Hence $$\frac{V_s'}{V_n} = \frac{C_x}{C_s}$$

Or $$V_s' = \frac{C_x}{C_s} V_n$$

The secondary coil of the transformer serves as the output of sensing circuit 102B with an output voltage $V_s$ that equals to (N is the turns ratio of transformer):

$$V_s = N \frac{C_x}{C_s} V_n = K_s V_n$$

In this example, the gain factor $K_s$ of the sensing circuit 102B equals to the product of the turns ratio N of the transformer and the capacitance of the capacitor $C_x$, divided by the capacitance of the capacitor $C_s$. The inductor $L_p$ may enable the flow of power (e.g., current, low frequency in nature) from the power source 20 to the electronic circuit 30 while the capacitor $C_s$ presents a high impedance to prevent the flow of power (e.g., current, low frequency in nature) from the power source 20 to the electronic circuit 30. The inductance of the transformer primary coil should be substantially larger than the inductance of inductor $L_p$ such that resonant frequency will not be substantially affected and power current flows mainly through the inductor $L_p$.

Figure 5:
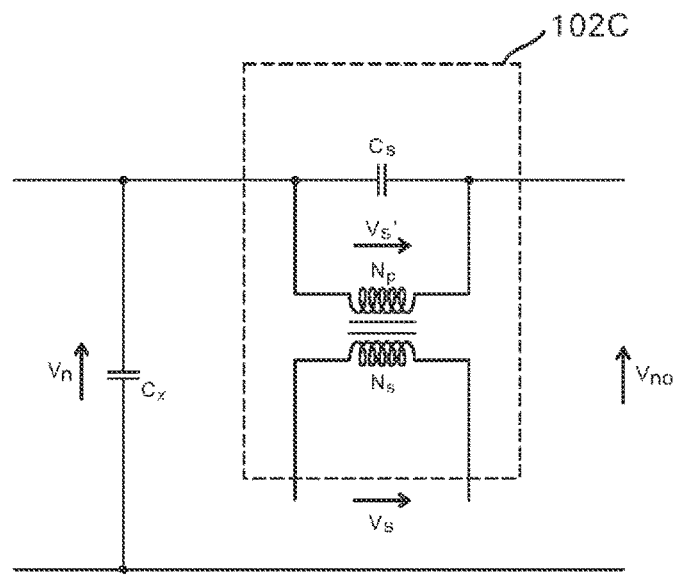
FIG. 5 is a circuit diagram of an implementation of a portion of the control circuit of FIG. 2 in one embodiment of the invention.

FIG. 5 shows another implementation of the sensing circuit 102C in one embodiment. In this embodiment, the input and the output of the sensing circuit 102C are isolated. The input terminals/nodes of the sensing circuit 102C are connected in series between the interference signal source $V_{no}$ and the capacitor $C_x$. The sensing circuit 102C includes a capacitor $C_s$ arranged at the input of the sensing circuit 102C, and a transformer connected in parallel to the capacitor $C_s$ and arranged at the output of the sensing circuit 102C. The transformer includes primary coil with $N_p$ turns and a secondary coil with $N_s$ turns, defining a turns ratio N ($N_s/N_p$). The transformer provides isolation between the input and output of the sensing circuit 102C. The primary coil of the transformer is connected directly in parallel with the capacitor $C_s$ to form a resonator circuit. The resonance frequency of the resonator circuit is arranged below the minimum frequency of the electromagnetic interference signal $V_n$ to be suppressed across the capacitor $C_x$ and above a frequency of the power source 20 such that the sensing circuit 102C can provide high pass and low pass functions as needed, e.g., can be considered as capacitor for high frequency signals and inductor (primary side of the transformer) for low frequency signals.

The interference signal $V_n$ to be suppressed across the capacitor $C_x$ and the sensed sign $V_s'$ at the input of sensing circuit 102C (the capacitor $C_s$) can be considered as a capacitive voltage divider of the noise signal $V_{no}$ according to Kirchhoff's voltage law as in the following expressions:

$$V_n = \frac{C_s}{(C_s + C_x)} V_{no}$$

$$V_s' = \frac{C_x}{(C_s + C_x)} V_{no}$$

Hence $$\frac{V'_s}{V_n} = \frac{C_x}{C_s}$$

Or $$V'_s = \frac{C_x}{C_s} V_n$$

The secondary coil of the transformer serves as the output of sensing circuit 102C with an output voltage $V_s$ that equals to (N is the turns ratio of transformer):

$$V_s = N \frac{C_x}{C_s} V_n = K_s V_n$$

In this example, the gain factor $K_s$ of the sensing circuit 102C equals to the product of the turns ratio N of the transformer and the capacitance of the capacitor $C_x$, divided by the capacitance of the capacitor $C_s$. The primary side of the transformer may enable the flow of power (e.g., current, low frequency in nature) from the power source 20 to the electronic circuit 30 while the capacitor $C_s$ presents a high impedance to prevent the flow of power (e.g., current, low frequency in nature) from the power source 20 to the electronic circuit 30.

Figure 6:
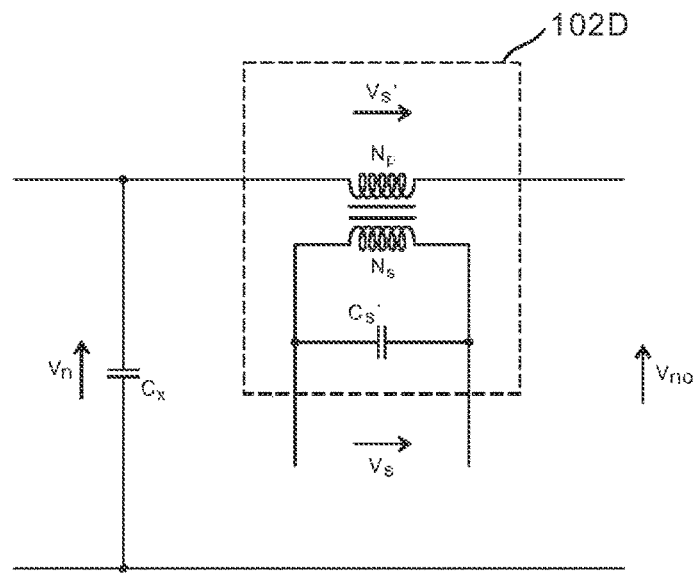
FIG. 6 is a circuit diagram of an implementation of a portion of the control circuit of FIG. 2 in one embodiment of the invention.

FIG. 6 shows another implementation of the sensing circuit 102D in one embodiment. The sensing circuit 102D in FIG. 6 is similar to the sensing circuit 102C in FIG. 5, except that the capacitor is moved to the output (FIG. 6) of the sensing circuit 102D. In this embodiment, the input and the output of the sensing circuit 102D are isolated. The input terminals/nodes of the sensing circuit 102D are connected in series between the interference signal source $V_{no}$ and the capacitor $C_x$. The sensing circuit 102D includes a transformer arranged at the input of the sensing circuit 102D, and a capacitor $C_s'$ connected in parallel to the transformer and arranged at the output of the sensing circuit 102D. The transformer includes primary coil with $N_p$ turns and a secondary coil with $N_s$ turns, defining a turns ratio N ($N_s/N_p$). The transformer provides isolation between the input and output of the sensing circuit 102D. The secondary coil of the transformer is connected directly in parallel with the capacitor $C_s'$ to form a resonator circuit. The resonance frequency of the resonator circuit is arranged below the minimum frequency of the electromagnetic interference signal $V_n$ to be suppressed across the capacitor $C_x$ and above a frequency of the power source 20 such that the sensing circuit 102D can provide high pass and low pass functions as needed, e.g., can be considered as capacitor for high frequency signals and inductor (primary and secondary sides of the transformer) for low frequency signals.

The interference signal $V_n$ to be suppressed across the capacitor $C_x$ and the sensed sign $V_s'$ at the input of sensing circuit 102D (primary side of the transformer) can be considered as a capacitive voltage divider of the noise signal $V_{no}$ according to Kirchhoff's voltage law as in the following expressions:

$$V_n = \frac{N^2 C_S'}{(N^2 C_S' + C_x)} V_{no}$$

$$V'_s = \frac{C_x}{(N^2 C_S' + C_x)} V_{no}$$

Hence $$\frac{V'_s}{V_n} = \frac{C_x}{N^2 C_S'}$$

Or $$V'_s = \frac{C_x}{N^2 C_S'} V_n$$

The secondary coil of the transformer serves as the output of sensing circuit 102D with an output voltage $V_s$ that equals to (N is the turns ratio of transformer):

$$V_s = \frac{C_x}{N C_S'} V_n = K_s V_n$$

In this example, the gain factor $K_s$ of the sensing circuit 102D equals to capacitance of the capacitor $C_x$ divided by the product of the turns ratio N of the transformer and the capacitance of the capacitor $C_s'$. The primary side of the transformer may enable the flow of power (e.g., current, low frequency in nature) from the power source 20 to the electronic circuit 30 while the capacitor $C_s'$ presents a high impedance to prevent the flow of power (e.g., current, low frequency in nature) from the power source 20 to the electronic circuit 30. Compared with the embodiment of FIG. 5, in this embodiment, arranging the capacitor $C_s'$ at the output instead of at the input of the sensing circuit can scale the capacitance of the capacitor $C_s'$ by the square of the transformer turns ratio N, thus enabling the capacitor $C_s'$ to have a small capacitance.

The control circuit and the electromagnetic interference suppression circuit in the above embodiments can be applied to circuit applications not specifically illustrated in the description and/or drawings.

It will be appreciated by persons skilled in the art that numerous variations and/or modifications may be made to the invention as illustrated with respect to the specific embodiments without departing from the scope of the invention as defined in the claims. The described embodiments of the invention are therefore in all respects illustrative and not restrictive.

For example, the shunt circuit need not be formed by a single capacitor, but can be formed by different electronic component(s) forming a high pass circuit. The sensing circuit may include different constructions of resonator circuits and/or transformers. The resonator circuits may be formed from different capacitive and inductive circuits. The resonant frequency of the resonator circuit need not be strictly below a frequency of the electromagnetic interference signal $V_n$ and above a frequency of the power source. The amplifier can be replaced with other regulator circuit and/or the controlled voltage source can be replaced with other circuit components, so long as they serve the purpose to cooperate with the sensing circuit and the controlled voltage source to suppress electromagnetic interference signals. The sensing circuit and/or the controlled voltage source can be connected on the supply line or the return line; the sensing circuit and the controlled voltage source can be connected on different lines or on the same line. The illustrated capacitor can be embodied by any capacitive circuit(s) or circuit component(s); the illustrated inductors can be embodied by any inductive circuit(s) or circuit component(s). In embodiments where a transformer is used, the turns ratio can be chosen depending on needs, so long as the overall circuit can suppress the electromagnetic interference signals. Likewise, the gain factors of the sensing circuit, the amplifier, and the controlled voltage source can be any values provided that the overall circuit can suppress the electromagnetic interference signals. Suppression of signals need not be complete elimination but can be reduction of signals by, e.g., at least 90%.

The invention claimed is:

1. A sensing circuit for an electromagnetic interference suppression circuit, comprising:
   an input adapted to be connected on a power line and in series between a load and a shunt circuit connected across power lines between a power source and the load; and
   an output operatively coupled with the input, and adapted to provide a signal ($V_s$) associated with an electromagnetic interference signal ($V_n$) generated by or at the load and arranged to be experienced by the shunt circuit for determining a suppression signal ($V_n'$) for reducing, or substantially eliminating, the electromagnetic interference signal ($V_n$);
   wherein the sensing circuit comprises:
   a resonator circuit; and
   a transformer connected in parallel with the resonator circuit;
   wherein one of the transformer and the resonator circuit provides the input and the other one of the transformer and the resonator circuit provides the output.

2. The sensing circuit of claim 1, wherein the input and output are isolated.

3. The sensing circuit of claim 1, wherein the resonator circuit is configured with a resonance frequency arranged below a frequency of the electromagnetic interference signal ($V_n$) to be suppressed and above a frequency of the power source.

4. The sensing circuit of claim 1, wherein the resonator circuit comprises a capacitive circuit and an inductive circuit connected in parallel.

5. An electromagnetic interference suppression circuit, comprising:
   the sensing circuit of claim 1, with the input connected on the power line;
   a regulator circuit adapted to regulate the signal ($V_s$) provided by the sensing circuit to provide a regulated signal; and
   a controlled signal source adapted to provide, based on the regulated signal, a suppression signal ($V_n'$) for reducing, or substantially eliminating, the electromagnetic interference signal ($V_n$).

6. The electromagnetic interference suppression circuit of claim 5, wherein the suppression signal ($V_n'$) has substantially the same magnitude as the electromagnetic interference signal ($V_n$); and/or
   wherein the suppression signal ($V_n'$) has an about 180 degrees phase shift from the electromagnetic interference signal ($V_n$).

7. The electromagnetic interference suppression circuit of claim 5,
   wherein the controlled signal source and the sensing circuit are connected on the same power line; or
   wherein the controlled signal source and the sensing circuit are connected on different power lines.

8. The electromagnetic interference suppression circuit of claim 5,
   wherein the controlled signal source is a controlled voltage source adapted to provide the suppression signal ($V_n'$) in the form of a suppression voltage signal.

9. The electromagnetic interference suppression circuit of claim 5, wherein the controlled signal source comprises a transformer.

10. The electromagnetic interference suppression circuit of claim 5, wherein the regulator circuit comprises an amplifier.

11. The electromagnetic interference suppression circuit of claim 5, further comprising:
    the shunt circuit connected across power lines between the power source and the load.

12. The electromagnetic interference suppression circuit of claim 11, wherein one of the controlled signal source and the sensing circuit is connected between the power source and the shunt circuit, and the other one of the controlled signal source and the sensing circuit is connected between the load and the shunt circuit.

13. The electromagnetic interference suppression circuit of claim 11, wherein the shunt circuit comprises a capacitive circuit.

14. A sensing circuit for an electromagnetic interference suppression circuit, comprising:
    an input adapted to be connected on a power line and in series between a load and a shunt circuit connected across power lines between a power source and the load; and
    an output operatively coupled with the input, and adapted to provide a signal ($V_s$) associated with an electromagnetic interference signal ($V_n$) generated by or at the load and arranged to be experienced by the shunt circuit for determining a suppression signal ($V_n'$) for reducing, or substantially eliminating, the electromagnetic interference signal ($V_n$);
    wherein the sensing circuit comprises:
    a transformer with primary and secondary coils; and
    a capacitive circuit connected in parallel with the transformer,
    wherein one of the transformer and the capacitive circuit provides the input and the other one of the transformer and the capacitive circuit provides the output; and
    wherein the capacitive circuit is connected in parallel with the primary coil to define a resonator circuit.

15. The sensing circuit of claim 14, wherein the resonator circuit is configured with a resonance frequency arranged below a frequency of the electromagnetic interference signal ($V_n$) to be suppressed and above a frequency of the power source.

16. An electromagnetic interference suppression circuit, comprising:
    the sensing circuit of claim 14, with the input connected on the power line;
    a regulator circuit adapted to regulate the signal ($V_s$) provided by the sensing circuit to provide a regulated signal; and
    a controlled signal source adapted to provide, based on the regulated signal, a suppression signal ($V_n'$) for reducing, or substantially eliminating, the electromagnetic interference signal ($V_n$).

* * * * *